United States Patent [19]

Graas

[11] Patent Number: 5,360,995
[45] Date of Patent: Nov. 1, 1994

[54] BUFFERED CAPPED INTERCONNECT FOR A SEMICONDUCTOR DEVICE

[75] Inventor: Carole D. Graas, Garland, Tex.

[73] Assignee: Texas Instruments Incorporated, Dallas, Tex.

[21] Appl. No.: 121,325

[22] Filed: Sep. 14, 1993

[51] Int. Cl.$^5$ .................. H01L 23/48; H01L 29/46; H01L 29/54

[52] U.S. Cl. .................. 257/751; 257/758; 257/763; 257/765

[58] Field of Search ............ 257/751, 750, 758, 763, 257/767, 765

[56] References Cited

U.S. PATENT DOCUMENTS

| | | | |
|---|---|---|---|
| 4,461,672 | 7/1984 | Musser | 156/644 |
| 4,673,592 | 6/1987 | Porter et al. | 427/53.1 |
| 4,795,722 | 1/1989 | Welch et al. | 437/192 |
| 4,996,133 | 2/1991 | Brighton et al. | 430/313 |
| 5,071,714 | 12/1991 | Rodbell et al. | 257/767 |
| 5,087,591 | 2/1992 | Teng | 437/225 |
| 5,171,642 | 12/1992 | DeHaven et al. | 257/750 |
| 5,202,579 | 4/1993 | Fujii et al. | 257/751 |
| 5,212,352 | 5/1993 | Brighton et al. | 174/264 |
| 5,966,865 | 10/1990 | Welch et al. | 437/192 |

OTHER PUBLICATIONS

J. J. Estabil, H. S. Rathore and E. N. LeVine, Gen'l. Techn. Div., IBM Corp., Hopewell Junction, N.Y. 12533; *Electromigration Improvements with Titanium Underlay and Overlay in Al(Cu) Metallurgey;* IEEE-1991/VMIC Conference, Jun. 11-12, 1991; pp. 242-248.

B. W. Shen, T. Bonifield, R. Blumenthal, R. Brothers and H. L. Tsai; *A Highly Reliable aluminum Metallization for Micron and Submicron VLSI Application;* IEEE-1986, V-MIC Conf., Jun. 9-10, 1986; pp. 191-197.

K/P/ Rodbell, D. B. Knorr and D. P. Tracy, IBM Resrch. Div., Yorktown Heights, N.Y. 10598; *Texture Effects on the electromigration Behavior;* Mat. Res. Soc. Symp. Proc. vol. 265, 1992; pp. 107-112.

*Primary Examiner*—Jerome Jackson
*Assistant Examiner*—Donald L. Monin, Jr.
*Attorney, Agent, or Firm*—Robby T. Holland; James C. Kesterson; Richard L. Donaldson

[57] ABSTRACT

Via reliability failure in ULSI devices having aluminum leads is significantly reduced by forming a thin layer of metal, such as Ti, between the aluminum conductor and its antireflection coating. Heating the metal causes it to react with the aluminum and form an intermetallic coating. Via hole formation is achieved by etching. During via formation, if the etch etchs through the antireflection coating, it should stop in the intermetallic layer as opposed to etching into the underlying aluminum conductor. The thin layer of metal may be heated to form the intermetallic during planarization when curing spin on glass, or, a separate anneal may be used with planarization such as by chemical mechanical polish.

4 Claims, 2 Drawing Sheets

BUFFERED CAPPED INTERCONNECT FOR A SEMICONDUCTOR DEVICE

FIELD OF THE INVENTION

This invention is in the field of semiconductors and more particularly relates to metallization and interconnects.

BACKGROUND OF THE INVENTION

The density of devices fabricated on semiconductor substrates continues to increase due in large part to decreasing feature sizes. For example, today's ultra large scale integrated (ULSI) devices, such as 16 megabit (Mb) dynamic random access memories (DRAMs) (illustrated in U.S. Pat. No. 5,202,279) issued to Chung et al.) are built using 0.5 micron technology while tomorrow's 64 MB DRAM are projected to incorporate 0.35 micron features. In order for minimization to continue, the processing used to manufacture and ensure the reliability of such sub-micron devices must continually be challenged, developed, and refined.

One important semiconductor processing area in need of improvement is metallization. Chapter 9, on pages 375–421, of *VLSI Technology Second Edition*, 1988, by S. M. Sze of AT&T Bell Laboratories discusses metallization as does Chapter 10, on pages 518–578, of *Semiconductor Integrated Circuit Processing Technology*, 1990, by W. R. Runyan and K. E. Bean of Texas Instruments.

Metallization provides interconnection between contacts on devices and between devices and the outside world. To make electrical connection between devices and the outside world, multilevels of metal are used. Typically, a recess (hole or via) is bored through a dielectric covering a first level of metal. The hole is filled with conductive material and a second level of metal is applied. The conductive material in the via provides electrical connection between the first and the second levels of metal.

As device feature sizes shrink, the aspect ratio of the vias increase. The aspect ratio is obtained by dividing the depth of the via by the width (diameter) of the via. Ultra Large Scale Integrated (ULSI) circuit devices such as the above described 16MB DRAM have vias around 1.5 microns deep and around 0.6 microns wide, thus giving them high aspect ratios on the order of about 2.5.

In ULSI multilevel metallization systems, interconnect via reliability performance problems can be associated with many process/design related factors. In particular, increasing via aspect ratios tend to emphasize via etch and clean up related issues. Etch residues produced by the highly-passivating etch chemistries such as $CHF_3$, $CF_4$, and $C_2F_6$ are becoming harder to remove completely, and more aggressive solvents have to be used. In the case of aluminum leads, this puts the exposed aluminum lead surfaces to a greater risk of damage. Tighter design rules require the use of highly directional and energetic reactive ion etch plasmas which then also expose the underlying aluminum to erosion or trenching by lack of selectivity. A trend towards all dry post via etch cleanup processes aids to prevent solvent induced defects but may create further damage to the aluminum surface by oxidation, whereas attempts to sinter the newly-etched via holes to burn off organic residues put the aluminum at risk of hillocking into the vias.

Electromigration undesirably affects via interconnect performance. Electromigration induced failure is probably the most important mode of failure in aluminum lines. Prior attempts to improve electromigration performance have involved utilizing antireflection coating (ARCs) capping layers. These ARCs are typically thin layers of various refractory metals such as TiN and TiW. The capping layers have been put above and below the aluminum leads to improve electromigration characteristics as discussed in the following papers: "A Highly Reliable Aluminum Metallization For Micron and Submicron VLSI Applications" by Shen et al., June 1986 V-MIC Conference; "Electromigration Improvements with Titanium Underlay and Overlay in Al(Cu) Metallurgy" by Estabil et al., June 1991 VMIC Conference; and, "Texture Effects On The Electromigration Behavior of Layered Ti/AlCu/Ti Films" by Rodbell et al. 1992 Materials Research Society Symposium Volume 265.

Despite providing improvements in electromigration, these thin capping layers still do not adequately protect the portion of the aluminum leads lying underneath high aspect ratio vias. The etch chemistries are typically not selective to the antireflective coatings and since these coatings are very thin, it is possible to etch into the underlying aluminum when etching the vias. This provides undesirable higher via resistance and greater standard deviation across a semiconductor wafer surface. Etching into the aluminum during the via etch exposes the aluminum to contamination from the etching plasma, the ambient, the cleaning agents necessary to remove etch residues, etc.

It is accordingly an object of the invention to improve the manufacturability and reliability of vias.

It is an additional object of the invention to provide an improved metal junction for interconnects in semiconductor devices.

Other objects and advantages will be apparent to those of ordinary skill in the art having reference to the following specification and drawings.

SUMMARY OF THE INVENTION

An improved metal junction for semiconductor devices includes a conductor having an intermetallic layer. The intermetallic layer protects the underlying conductor during via etch by providing a buffer that the etch may stop within. The intermetallic may be created by forming a thin metal layer between the conductor and an antireflection coating. Heating the thin metal layer causes it to react with the conductor and form the intermetallic. When planarizing the patterned metal conductors with a dielectric such as spin on glass, curing the spin on glass sufficiently heats the thin metal layer to facilitate the reaction.

DETAILED DESCRIPTION OF PREFERRED EMBODIMENT

Figure 1:
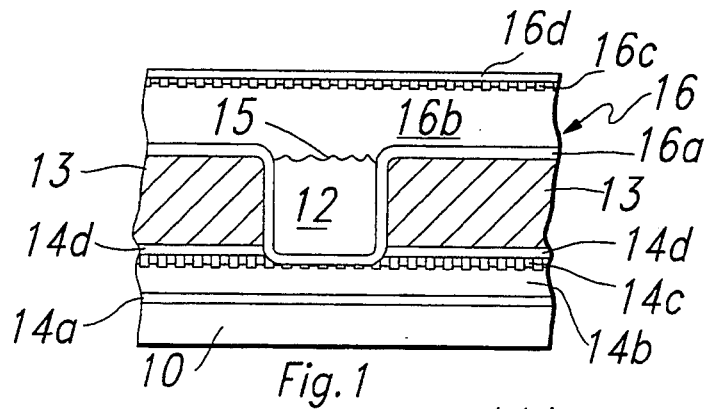
FIG. 1 is an enlarged cross section drawing illustrating a resulting capped metallization structure formed in accordance with a preferred method of the invention.

FIG. 1 is an enlarged cross section drawing illustrating a resulting capped multilevel metallization structure formed in accordance with a preferred method of the invention wherein a semiconductor wafer 10 has a via 12 filled with conductive material 15 coupling a first layer of metal 14 and a second level of metal 16. Semiconductor wafer 10 has active devices (unillustrated) formed therein. Illustrative active devices include, for example, submicron devices such as 16 Mb DRAMs built to 0.5 micron design rules and 64MbDRAMs built to even smaller 0.35 micron design rules. It is understood that first metal layer 14 couples to the active devices generally through contacts which are also unillustrated.

In FIG. 1, via 12 is representative of a high aspect ratio via. In a 0.5 micron device, it may be around 1.5 microns deep and around 0.6 microns wide. It is filled with conductive material 15. Conductive material 15 thus forms electrical connection between the underlying first metal level 14 and the overlying second metal level 16. While different conductive materials are suitable to fill via 12, in this example tungsten forms conductive material 15. The tungsten filled via 12 is referred to as a tungsten plug. Aluminum or an aluminum alloy is exemplary of other plug conductors. A barrier layer 16a that forms part of metal layer 16, described with more particularity below, lines via 12 and thus conductive material 15 lies on top of barrier layer 16a inside via 12.

Figure 2:
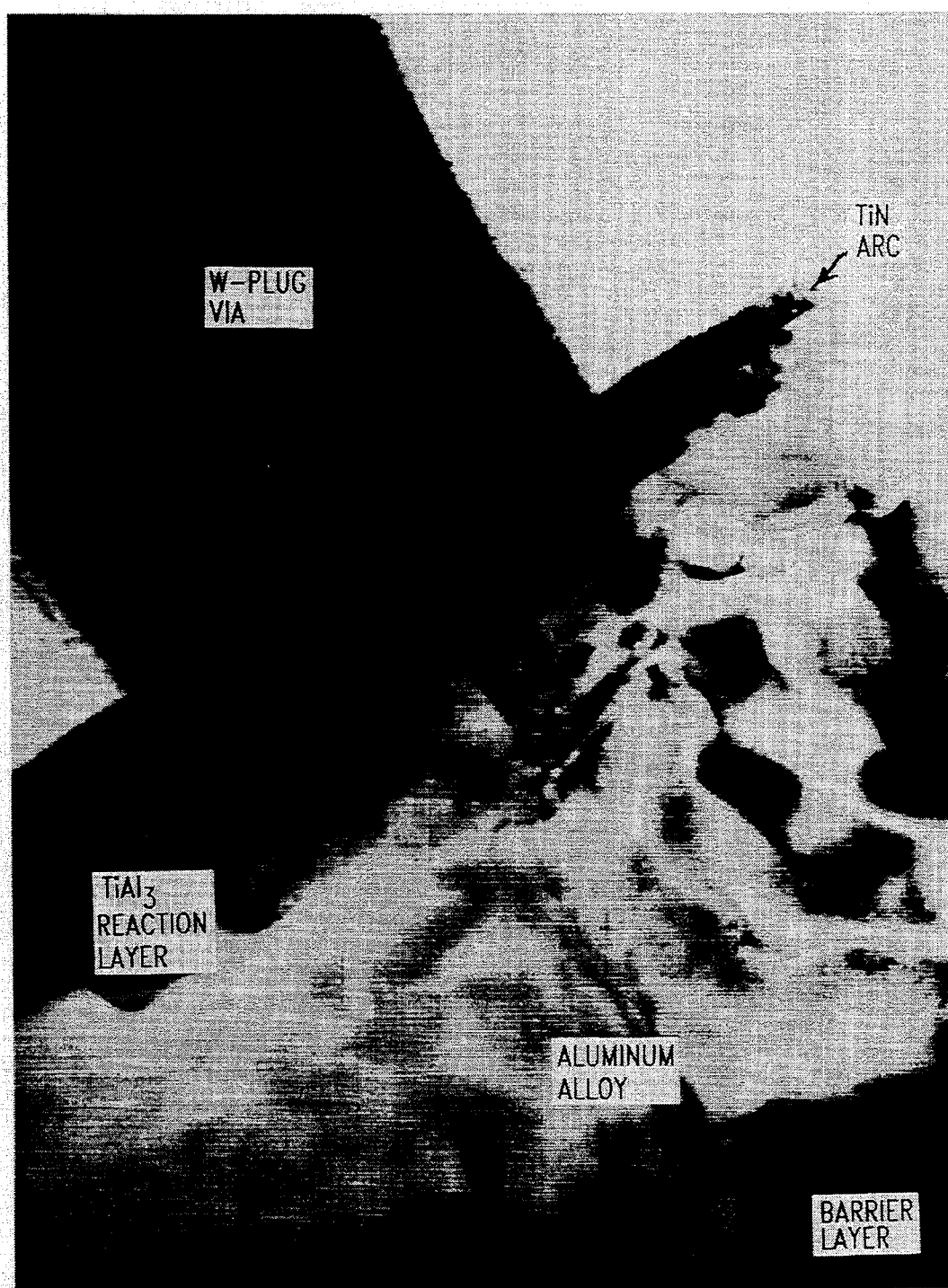
FIG. 2 is a TEM micrograph of a structure similar to FIG. 1 formed in accordance with the preferred method of the invention.

In FIG. 2, metal layer 14 and metal layer 16 are similarly constructed stacked metal layers. Discussion follows with respect to metal layer 14, it being understood that the same discussion applies to metal layer 16. Metal layer 14 is comprised of a bottom layer 14a, a second layer 14b covering the bottom layer 14a, a third layer 14c covering the second layer 14b, and a top layer 14d. Layer 14a is a thin barrier layer of metal. Suitable barrier metals include single layer of metals such as titanium nitride TiN, titanium tungsten TiW, titanium Ti etc. and multilayers such as titanium/titanium nitride Ti/TiN. These barrier metals would be suitable for both tungsten and aluminum plugs. In 0.5 design rules, layer 14a may be around 1000 angstroms while in 0.35 micron design rules, it may be around 500 angstroms, Å, thick. Metal layer 14b is thick conductor layer. Exemplary is an aluminum alloy that may contain a small amount of copper and silicon, such as around 0.5% copper and around 1% silicon. Metal layer 14b may be in the range or about 4000-8000 angstroms thick for both 0.5 and 0.35 micron design rules.

In FIG. 1, layer 14c is a thin continuous intermetallic layer. It is formed by the below described novel process and advantageously provides a "safety margin" during via etch so that if the etch should overetch, it will etch into the intermetallic and not into the underlying layer 14b. When layer 14b is an aluminum alloy, intermetallic layer 14c can be formed by metals that react with aluminum, such as, but not limited to, titanium Ti, zirconium Zr, hafnium Hf, chromium Cr, molybdenum Mo, tungsten W, copper Cu, palladium Pd, platinum Pt, and nickel Ni. For example, Ti reacts with aluminum to form $TiAl_3$. Metal layer 14d is also a thin layer. It provides an antireflective coating (ARC) for metal stack 14. TiN is exemplary of a suitable ARC coating. The combined thickness of layers 14c and 14d should be as thin as possible so as to not unduly increase the height of metal stack 14 and thereby cause planarization problems. A combined thickness in the range of about 300-700 angstroms is suitable with layer 14c preferably around 200-400 angstroms and layer 14d preferably around 300 angstroms.

FIG. 2 is a transmission electron microscopy (TEM) micrograph of a semiconductor cross section showing a structure similar to FIG. 1 manufactured in accordance with the preferred embodiment of the invention as later herein described. The metal layer 16, the dielectric 13, and the semiconductor device 10 of FIG. 1 are not illustrated in FIG. 2. Note that the tungsten filled plug extends into the intermetallic layer 14c. The TEM micrograph illustrates the granular nature of intermetallic layer 14c.

The novel process for manufacturing the buffered capped metal structure of FIG. 1 is now provided. It is to be understood that FIGS. 3-7 are not to scale.

Figure 3:
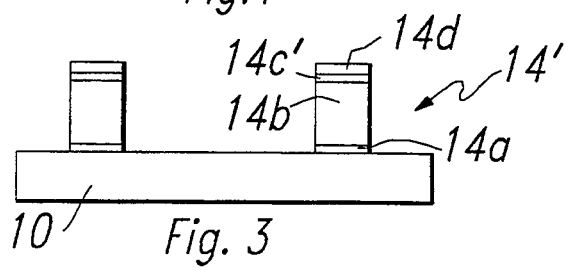
FIGS. 3–7 are cross sectional drawings illustrating successive stages in fabricating the structure of FIG. 1 in accordance with the preferred method of the invention.

FIG. 3 illustrates semiconductor wafer 10 having a resulting metal stack 14' formed thereon. [The metal stack 14' is a precursor to the above described metal stack 14]. It is understood that prior semiconductor processing steps will form active devices in semiconductor wafer 10, or on semiconductor wafer 10 in case of an epitaxial layer, and will form contacts. Barrier layer 14a is first formed over semiconductor wafer 10 such as by sputter deposition. The thickness of barrier layer 14a is determined by the design rules as previously explained. In this exemplary flow, TiN forms layer 14a. Conductor layer 14b is next formed on top of layer 14a. Again, sputtering is exemplary to formlayer 14b to the desired thickness. In this exemplary flow, Al-Si-Cu forms layer 14b. Next, a thin layer of metal 14c' is formed on top of conductor layer 14b. Layer 14c' provides the metal which will later react with the aluminum alloy conductor layer 14b to form the intermetallic layer 14c. In this exemplary flow, a thin layer of Ti of about 200-400 angstroms is sputtered onto layer 14b to form layer 14c'. Next, a thin antireflective coating 14d is formed over layer 14c'. In this exemplary flow, about 300 angstroms of TiN is sputtered on top of the Ti layer 14c'.

With further reference to FIG. 3, after the antireflective coating 14d is formed, the metal layer 14' includes the barrier layer 14a, the overlying conductive layer 14b, the thin metal layer 14c' that provides the source for intermetallic formation, and the thin ARC coating 14d. The metal layer 14' is next conventionally patterned to the desired specifications, such as, for example 0.5 and 0.35 microns. To pattern metal layer 14', a resist mask having the desired linewidth pattern is conventionally formed over metal layer 14'. A plasma etch then occurs which transfers the pattern to metal layer 14'. A suitable plasma etch, for example, is an RIE etch as may be performed in a commercially available etcher such as an Applied Materials 5000. Suitable etchants include those based upon BCL3 or CCL4 chemistries. Such a plasma etch will anisotropically etch the portion of metal layer 14' not covered by the patterned resist mask down to a dielectric covering, typically oxide (unillustrated) that covers semiconductor wafer 10. The desired linewidth pattern in the photoresist is thus transferred to metal layer 14'. In a 16MB DRAM application, the width of patterned metal layer 14' is about 0.5 microns. The semiconductor wafer is then cleaned to remove the overlying resist and etch residue from the patterned features. This typically occurs by placing the wafer in a solvent.

Figure 4:
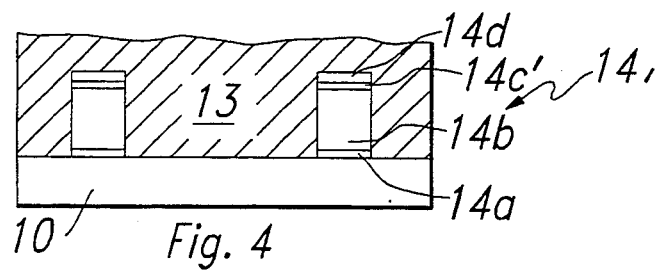

FIG. 4 illustrates the resulting structure following application of a dielectric layer 13. Dielectric layer 13 helps planarize the topography of the etched features on semiconductor wafer 10. Exemplary is an application of spin on glass, SOG. Other suitable planarizing substances include polyimides of the low k dielectric type. As will be explained below, it is desirable that the planarizing dielectric layer 13 have a relatively low curing temperature to avoid damaging the underlying aluminum lines 14'; however, the temperature must be high enough to cause the metal layer 14c' to react with aluminum layer 14b and thereby form the intermetallic layer 14c. The thickness of planarizing dielectric layer 13 is of course dependent upon the height of metal stack 14' with layer 13 covering metal stack 14'.

Figure 5:
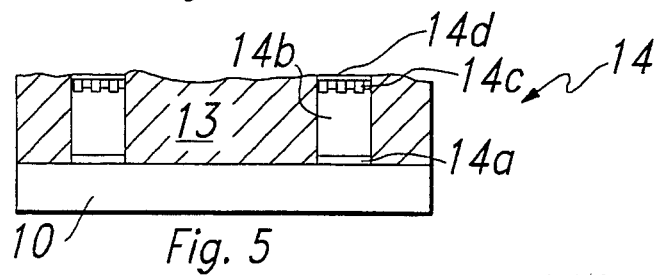

FIG. 5 shows the resulting structure following curing and etch back of the planarizing layer. When SOG is used as the planarizing layer, heating it between about 300–400° C. is sufficient to densify it. Of course, the time of heating varies according the thickness applied. If, for example, about 3400 Å of SOG were applied, then heating it for about an hour is sufficient. The curing temperature should be below about 450° C. to avoid damaging the aluminum metal lines as aluminum starts to "move" at around 500° C. The low k polyimide dielectrics will cure between about 300–350° C.

With further reference to FIG. 5, as the planarizing layer 13 is heated, this heats the metal stack 14'. As the metal layer 14c' is heated, it reacts with the underlying aluminum conductor layer 14b and forms a continuous intermetallic. When Ti forms metal layer 14c', heating the titanium atoms causes them to diffuse into the grain boundaries of the quasi-bamboo aluminum lead structure and form a continuous intermetallic layer comprised mostly of $TiAl_3$. The 200–400 Å of sputtered Ti of metal layer 14c' will form an intermetallic layer 14c of about 500–1500 Å. After stabilizing the planarizing layer 13, it is etched back to near the top of metal stack 14 to complete planarization.

Figure 6:
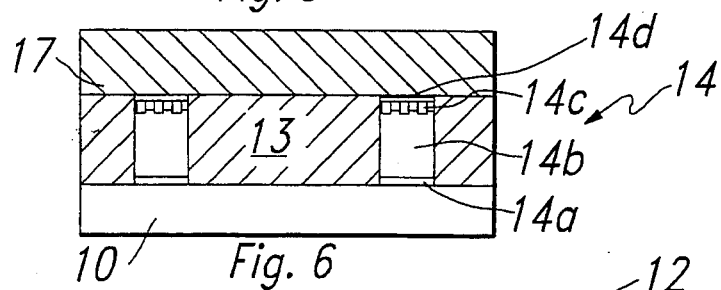

FIG. 6 reveals the resulting structure following formation of an insulating layer 17. After planarization has occurred, a thick insulating layer such as, for example, plasma enhanced conformal vapor deposited TEOS may be formed to a desired thickness. In 0.5 micron design rules, 10,000 Å of TEOS would be sufficient to form the thick insulating layer 17.

With reference to FIGS. 4, 5, and 6, it is to be noted that in an alternative embodiment process, it is possible to use a lower temperature planarizing process. In this process, an oxide such as, for example, plasma enhanced conformal vapor deposited TEOS may be formed to a desired thickness. A sinter step would then be necessary to react the metal layer 14c' to form the intermetallic layer 14c. The sinter would be subject to the above described temperature constraint of being less than about 450° C. Planarization could then be accomplished by chemical mechanical polish, CMP,, for example, to remove the excess oxide.

Figure 7:
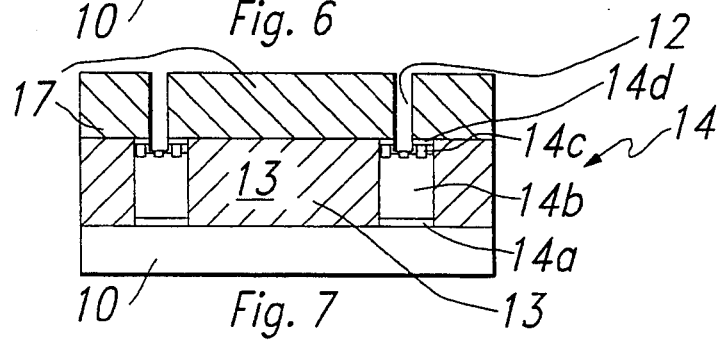

FIG. 7 reveals the resulting structure following via pattern and etch. The vias may be conventionally patterned by coating dielectric layer 17 with photoresist and then exposing and developing the resist. An etch step etches through dielectric layer 17. An exemplary oxide etch suitable to open the high aspect ratio vias is one of $CHF_3/CF_4$ at about 650 mtorr. An oxygen plasma ash will then remove the resist and a solvent clean will remove etch residue.

With reference to FIG. 7, note that the bottom of via 12 may extend into intermetallic layer 14c. As mentioned in the Background Of The Invention, the etch chemistries are typically not selective to the antireflective coatings 14d and since these coatings are very thin, it is possible to etch into the underlying aluminum 14b when etching the vias 12. This provides undesirable higher via resistance and greater standard deviation across a semiconductor wafer 10 surface. Additionally, etching into the aluminum 14b during the via etch exposes the aluminum 14b to contamination from the etching plasma, the ambient, the cleaning agents necessary to remove etch residues, etc. However, the intermetallic layer 14c can advantageously act as a buffer which prevents damage to the underlying aluminum 14b during via etch and cleanup, as well as oxidation. Since 200–400 Å of sputtered Ti of metal layer 14c' will form an intermetallic layer 14c of about 500–1500 Å, the etch can be optimized to stop within about the first 1000 Å of intermetallic and not reach the underlying aluminum. The intermetallic layer 14c can thus advantageously provide a margin of safety for via etch.

With reference back to FIG. 1, further unillustrated processing steps occur to fill via 12 and create the second level of metal 16. A thin layer 16a of barrier material such as TiN may be sputtered followed by either selective W deposition or blanket conformal vapor deposition of W to fill via 12. If blanket W sputtering is used, a W etch will remove the undesired portion of W over layer 17. This will be followed by suitable steps to create metal layers 16b, 16c, and 16d such as those described above with reference to forming metal layers 14b, 14c', 14d, and 14c.

As the above discussion reveals, a thin layer of titanium 14c' may be placed between the aluminum alloy lead 14b and its ARC layer 14d. By placing the titanium underneath, and not in place of a traditional refractory metal capping layer, advantage may be taken of three effects. First, the titanium completely reacts with the aluminum to form a continuous intermetallic layer during interlevel dielectric processing. The following via etch should stop within the intermetallic rather than reaching into the underlying aluminum. The intermetallic not only acts as a buffer to prevent damage, it may also help getter leftover impurities. Both mean via-chain resistance and standard deviation via-chain resistance are significantly reduced. Via electromigration mean time to failure increases significantly with significant decrease in the standard deviation of the failure distribution. Second, the titanium atoms diffuse into the grain boundaries of the quasi-bamboo aluminum lead structure. This makes the aluminum much more resistant to electromigration. Third, the overlying refractory metal, TiN, layer 14d provides better antireflective properties than if titanium alone were used.

Other advantage is that since the added titanium layer is only in the order of a few hundred angstroms, it does not impact processes that are sensitive to the height of the interconnect stack, such as planarization. Additionally, by varying the titanium to aluminum thickness ratio, the aluminum sheet resistance can be optimized.

While the invention has been described with reference to illustrative embodiments, this description is not intended to be construed in a limiting sense. Various other embodiments of the invention will be apparent to persons skilled in the art upon reference to this description. It is therefore contemplated that the appended claims will cover any such modifications of the embodiments as fall within the true scope and spirit of the invention.

What is claimed is:

1. A buffered capped interconnect for a semiconductor device, comprising:

a first barrier layer;

a first aluminum lead overlying the first barrier layer;

a first intermetallic layer overlying the first aluminum lead;

a first antireflection capping layer overlying the first intermetallic layer;

an insulator overlying the first antireflection capping layer, the insulator having an opening including a top and a bottom, the bottom extending through the first antireflection layer and into the first intermetallic layer;

a second barrier layer overlying the insulator and lining the opening in the insulator;

a second aluminum lead overlying the second barrier layer;

a second intermetallic layer overlying the second aluminum lead;

a second antireflection capping layer overlying the second intermetallic layer; and a conductive plug in the opening of the insulator.

2. The buffered capped interconnect of claim 1 wherein the first barrier layer and the first antireflection layer is titanium nitride.

3. The buffered capped interconnect of claim 2 wherein the first intermetallic layer lead is titanium aluminide, $TiAl_3$.

4. The buffered capped interconnect of claim 3 wherein the conductive plug is tungsten.

* * * * *